United States Patent [19]

Lee et al.

[11] 4,064,620

[45] Dec. 27, 1977

[54] ION IMPLANTATION PROCESS FOR FABRICATING HIGH FREQUENCY AVALANCHE DEVICES

[75] Inventors: Don H. Lee, Agoura; Kenneth P. Weller, Rancho Palos Verdes; Robert S. Ying, Westminster; William F. Thrower, Cerritos, all of Calif.

[73] Assignee: Hughes Aircraft Company, Culver City, Calif.

[21] Appl. No.: 652,943

[22] Filed: Jan. 27, 1976

[51] Int. Cl.$^2$ .................. B01J 17/00; H01L 21/265
[52] U.S. Cl. .................................. 29/580; 29/589; 148/175; 148/187; 148/1.5; 331/107 G; 357/12; 357/13; 357/20; 357/58; 357/81; 357/91
[58] Field of Search ............... 148/1.5, 175, 187; 29/577, 580, 589; 357/12, 13, 91, 20, 56, 58, 59, 81; 331/107 G

[56] References Cited

U.S. PATENT DOCUMENTS

| | | | |
|---|---|---|---|
| 3,516,017 | 6/1970 | Kaneko et al. | 331/107 G |
| 3,595,716 | 7/1971 | Kerr et al. | 148/187 |
| 3,609,474 | 9/1971 | Vincent | 357/81 X |
| 3,620,851 | 11/1971 | King et al. | 148/1.5 |
| 3,628,185 | 12/1971 | Evans et al. | 331/107 G |
| 3,634,738 | 1/1972 | Leith et al. | 148/1.5 X |
| 3,663,874 | 5/1972 | Fukukawa et al. | 357/13 |
| 3,689,993 | 9/1972 | Tolar | 29/580 X |
| 3,737,985 | 6/1973 | Zoroglu et al. | 357/81 X |
| 3,814,997 | 6/1974 | Takahashi et al. | 357/13 X |
| 3,909,119 | 9/1975 | Wolley | 357/13 |
| 3,916,427 | 10/1975 | Ying et al. | 357/13 |
| 3,943,552 | 3/1976 | Shannon et al. | 357/13 X |

OTHER PUBLICATIONS

Seidel et al., "Double-Drift-Region Ion Implanted . . . Impatt Diodes," Proc. IEEE, vol. 59, No. 8, Aug. 1971, pp. 1222-1228.
Hammerschmitt, Jr., "Silicon Snap-off Varacator . . . Impatt Diode . . . Oscillators," Siemens Review, vol. 42, No. 1, Jan. 1975, pp. 44-47.
SZE et al., "Microwave Avalanche Diodes," Proc. IEEE, vol. 59, No. 8, Aug. 1971, pp. 1140-1154.
Oberai, A. S., "Combined Ion Implanted-Diffusion Emitter," I.B.M. Tech. Discl. Bull., vol. 13, No. 10, Mar. 1971, p. 2828.

*Primary Examiner*—L. Dewayne Rutledge
*Assistant Examiner*—W. G. Saba
*Attorney, Agent, or Firm*—William J. Bethurum; W. H. MacAllister

[57] ABSTRACT

Disclosed are new high frequency ion implanted passivated semiconductor devices and a planar fabrication process therefor wherein initially an ion implantation and PN junction passivation mask is formed on one surface of a semiconductor crystal. Thereafter, one or more conductivity type determining ion species are implanted through an opening in the mask and into the semiconductor crystal to form active device regions including a PN junction, all of which are bounded by an annular, higher resistivity unimplanted region of the semiconductor crystal. The PN junction thus formed terminates beneath the implantation and passivation mask, and the semiconductor crystal is then annealed to remove ion implantation damage and to electrically activate the ion implanted regions, while simultaneously controlling the lateral movement of the PN junction beneath the passivation mask. Such annealing does not adversely affect the conductivity and passivation characteristics of either the higher resistivity annular region or the passivation mask, and the resultant device structure exhibits a small degradation in high frequency performance relative to comparable state of the art unpassivated devices. Devices fabricated with the present new passivated geometry have a structure with sufficient mechanical strength to allow direct mounting into high frequency circuits (of the microwave waveguide-cavity type) without the use of additional package arrangements.

7 Claims, 25 Drawing Figures

ION IMPLANTATION PROCESS FOR FABRICATING HIGH FREQUENCY AVALANCHE DEVICES

FIELD OF THE INVENTION

This invention relates generally to ion implanted PN junction semiconductor devices and more particularly to high frequency semiconductor diodes having improved electrical and structural characteristics. The invention is also directed to a novel planar fabrication process for achieving excellent control over PN junction area, device geometry and impurity concentration, while simultaneously controlling and minimizing the high frequency loss characteristics of the passivated diode structure thus produced.

BACKGROUND AND RELEVANT PRIOR ART

Solid state multi-layer avalanche diodes, such as silicon or gallium arsenide IMPATT diodes for example, have been used for several years in the microwave industry as active semiconductor devices in microwave oscillators and amplifiers. To a first order approximation, the operational frequency, $f$, in GHz of these diodes, e.g. single-drift-region IMPATT diodes, is related to the width, W in micrometers, of the intermediate P or N type layer of three layer avalanche diodes as follows:

$$f(\text{GHz}) = 30/\text{W}(\mu\text{m}) \qquad \text{Eq. 1}$$

In the construction of microwave oscillators and amplifiers, it has been one practice to mount these semiconductor diodes on one surface of a waveguide cavity and thereafter make DC electrical contact to these diodes using a pin or post-like connection. Such contact is necessary to supply the diodes with appropriate DC operating bias for oscillation or amplification of microwave energy.

As the maximum operating frequency requirements for these semiconductor diodes were increased, especially with the interest in increasing the operational frequency of solid state oscillators and amplifiers into the millimeter wavelength range, it became necessary to reduce the geometry of these diodes, e.g. IMPATT diodes, to produce a corresponding reduction in the width of the P and N type layers forming the diodes, as specified by Eq. 1. This requirement for reducing the geometry of these solid state diodes obviously produced a corresponding reduction in their structural strength and ability to withstand contact pressures, such as the contact pressures produced when a DC bias pin is brought directly into contact with one surface of the diode.

To alleviate the latter problem, workers in this art began to mount the diodes in a manner that would eliminate the requirement for directly contacting one surface of the diode with the DC bias pin. One of the approaches used to accomplish this involved mounting one surface of the diode on a conducting substrate forming part of an insulating package and extending a conductive ribbon from the tab of the vertical insulator down into electrical contact with the second surface of the diode. Now the upper portion of the package could be utilized for making direct pressure contact to a DC bias pin, and the diode itself was removed from any direct pressure from such a pin. This type of package structure is disclosed, for example, in an article by N. B. Kramer entitled "IMPATT Diodes and Millimeter Wave Applications Grow Up Together" *Electronics,* Oct. 11, 1971, at page 79.

The electrical characteristics of the above and other similar packaging techniques can be represented by a lumped element equivalent circuit of parasitics near the active diode. In the simplest form, this parasitic equivalent circuit consists of a lead inductance in series with the active diode, and this series combination is shunted by a parallel combination of a conductance, G, and capacitance, C of the remainder of the package. Thus, the total parasitic equivalent capacitance C and inductance L causes the package to have a natural resonant frequency $f_{pack}$ which is inversely proportional to the square root of LC, that is:

$$f_{pack} \, \alpha \, (1/\sqrt{LC}) \qquad \text{Eq. 2}$$

The above described package must not only provide an arrangement to remove mechanical pressure from the diode as mentioned, but the electrical properties of the package must be such that they do not greatly detract from the interaction between the diode and the microwave cavity in which the diode is mounted. This is accomplished by making G small to reduce the conductance loss of the package, and by either making $f_{pack}$ much higher than the operating frequency $f$ of the diode (minimizing the impedance transformation from the diode chip to the package terminals) or by making $f_{pack}$ close to the operating frequency of the cavity in order to use the package transformation as part of the diode/waveguide impedance matching network. However, at frequencies $\geq$ 100 GHz, the parasitic inductance and capacitance associated with these packages produces a natural resonance $f_{pack}$ which is below the desired operation frequency, making it difficult to realize the proper device-circuit interaction. In any event, it is desirable from the point of view of circuit design to provide a package arrangement with reproducible parasitics so that the circuit configuration can be designed to compensate for these parasitics as much as possible.

Another difficulty that arises in the construction of diodes for operation above 100 GHz is the mechanical damage that occurs to the diode during the fabrication of the package arrangement. That is, the size (area) of these diodes becomes reduced to such an extent that the strength of the metal contact bond to the diode is weakened and contact bonding failures often occur.

In the fabrication of high-frequency semiconductor devices of the type described, it is also important to control the DC electrical characteristics for optimum device performance. A feature common to certain such device structures formed with a mesa geometry is the exposure of their *p-n* junctions to an uncontrolled environment. The electrical characteristics of these devices, notably the reverse-bias leakage currents associated with exposed or unpassivated junctions, are more difficult to control when compared to junctions that are passivated. It is desirable, therefore, to develop a package arrangement that not only has mechanical strength and low-losses at high frequencies, but one that also provides complete passivation of the *p-n* junction.

One prior art approach for fabricating semiconductor devices that have uniform avalanche breakdown junction characteristic of mesa device structures while providing the desirable junction passivation is described in a U.S. Pat. No. 3,649,386 issued to B. T. Murphy. In Murphy's approach, a dielectric layer, such as silicon dioxide, is formed around the edges of the mesas, so that the top surface of the dielectric layer is substantially coplanar with the top surfaces of the individual semiconductor mesas. This oxide provides surface passivation of the *p-n* junction as well as structural support for the mesas in a subsequent contact bonding operation. The silicon dioxide dielectric has a low conductance G and thus produces a minimum amount of resistive loss at high frequencies. To minimize the parasitic inductance L associated with this planar-mesa package, the top and bottom surface of the planarized mesas can be bonded directly to layers of contact and heat sink metallization. Such metallization completes the package for the diode, and the top and bottom metal surfaces of the above package may be contacted directly to a DC bias pin in a microwave cavity or the like.

The above planar-mesa approach to semiconductor diode packaging has, however, several distinct disadvantages, among which include the difficulty in adjusting the oxide thickness to the exact height of the mesa in order to obtain an oxide surface which is coplanar with the mesa height. Additionally, the high temperatures necessary for the thermal oxide growth cause a significant diffusion of the previously established doping profiles, resulting in degradation of device performance.

When Murphy's approach in U.S. Pat. No. 3,649,386 to junction passivation is combined with an additional etching step that produces another mesa in the oxide surrounding the previously formed semiconductor mesa, a passivated structure is formed that can be directly bonded to a heat sink, as described in U.S. Pat. No. 3,896,478 by R. Henry. The major disadvantage of this approach for high-frequency devices designed to operate at millimeter-wavelengths is the large shunting reactance associated with the thin silicon dioxide layer that surrounds the *p-n* junction of the semiconductor mesa. Furthermore, reduction to practice of structures similar to the one purposed by Henry necessitates several complicated processing steps that result in low device yields.

Another approach for fabricating passivated semiconductor diodes of the general type described without requiring ribbon bonding and its associated housing support members is described in U.S. Pat. No. 3,558,366 to M. P. Lepselter. Lepselter's approach is to bombard selected regions of a silicon crystal with gold ions in order to raise the resistivity of the silicon crystal around the active diode regions therein. The Lepselter approach has several disadvantages, among which include the very high acceleration energies necessary to accelerate gold ions (of heavy mass) to the required depth into the silicon crystal. Other disadvantages of the Lepselter approach include the requirement for accelerating these gold ions through an oxide layer on the surface of the silicon crystal and also the ion implantation damage to the silicon crystal; In Lepselter's process this damage must either go unannealed in the fabrication of the ultimate device structure, or if annealed the annealing temperatures produce significant lateral and horizontal diffusion of the implanted gold ions, which result in either degradation or destruction of the device's PN junction geometry and performance.

Another prior art approach to fabricating devices of the general type described herein is disclosed in an article by Foyt et al. entitled "Isolation of Junction Devices in GaAs Using Proton Bombardment" in *Solid-State Electronics*, vol. 12, 1969 pp. 209–214. In the above Foyt et al. process, protons are utilized to bombard and raise the resistivity of certain layers of gallium arsenide IMPATT diodes in order to define the active device region of these structures and provide passivation therefor. By using proton bombardment, the Foyt et al. approach does not require the high acceleration potentials required in the above Lepselter approach. But the Foyt et al. approach, like the Lepselter approach, produces an ultimate device structure in which proton bombarded high resistivity (semi-insulating) regions must necessarily be unannealed, thereby leaving the semiconductor crystal damaged in that portion of the structure bombarded by protons and immediately surrounding the active device regions of the diode structure.

Thus, the above described Foyt et al. and Lepselter approaches are similar in that both of these processes first introduce conductivity type determining impurities into the semiconductor crystal to establish the doping profiles of the active device regions and define the PN junctions therein, and thereafter utilize particle bombardment and implantation to control the exact geometry and current limiting necessary for the active device regions. Thus, this prior art sequence of processing steps leaves the particle bombardment damage present in the ultimate device structure.

Summarizing, therefore, in all of the Lepselter, Foyt et al. and planar-mesa approaches described above, the impurity concentration and PN junctions for the active device regions are formed first, and thereafter geometry control, passivation and current limiting for these regions (and PN junctions) are provided last. Obviously, any attempt to anneal the semiconductor structures thus formed and remove implantation damage after completion of these implantation steps would adversely lower the resistivity of the semiconductor crystal which was intentionally raised by ion implantation in the first place. Although the passivation feature is retained in these approaches, the lower resistivity of the semiconductor leads to significant degradation of the microwave characteristics of the active device. And if annealing is attempted in the Lepselter approach described above, significant degradation of the active PN junction area is produced by the above described enhanced diffusion effects.

THE INVENTION

The general purpose of this invention is to provide a totally new approach to the fabrication of planar high-frequency semiconductor devices wherein, contrary to the above prior art approaches, the passivation and current limiting regions of the semiconductor device are formed first, and thereafter conductivity type determining ions are implanted into selected regions of the semiconductor crystal to control the geometry, impurity concentration and profile, and PN junction location for the active device regions of the structure. Since the formation of the passivation and current limiting regions of the device structure do not require particle bombardment or implantation, the present novel device structure may be annealed after the ion implantation doping in order to remove ion implantation damage of the semiconductor crystal, in order to electrically activate the ion implanted regions thereof, and in order to control the lateral position of the PN junction within the device structure.

To achieve this purpose, we have discovered a novel ion implantation planar process which includes, among other things, forming an insulating ion implantation mask on the surface of a semiconductor crystal of predetermined high resistivity and thereafter implanting conductivity type determining ions through an opening in the mask and into the crystal to define the lower resistivity active device region or regions within the semiconductor crystal. The active device regions thus formed are surrounded by a higher resistivity current limiting annular non-implanted region, and the PN junction thus formed terminates beneath the insulating mask. The device structure is then annealed at a predetermined elevated temperature in order to remove ion implantation damage, to electrically activate the ion implanted regions, and also to simultaneously control the lateral movement of the PN junction beneath the insulating and passivating ion implantation mask. Such annealing does not adversely affect either the resistivity or passivation characteristics respectively of either the semiconductor crystal or the insulating mask formed thereon.

Electrical contacts and heat sinking may be provided on both sides of the ion implanted semiconductor crystal, and the structure is then appropriately masked and etched in order to form a mesa geometry in the contiguous semiconductor and insulating layers to in turn reduce the device reactances and their corresponding microwave losses. The ultimate device equivalent circuit has one electrical path which includes the main current path or PN junction impedance of the device, and another parallel, high impedance path which includes both the high impedance of the insulating mask and the relatively high impedance of the non-implanted annular region. The insulating mask exhibits a very high overall impedance which tends to minimize microwave losses during high frequency device operation.

Accordingly, it is an object of the present invention to provide a new and improved ion implantation planar process for fabricating a wide variety of high frequency semiconductor devices, such as single and double drift IMPATT diodes, Read-type IMPATT diodes, PIN diodes, varactor diodes, Schottky diodes, mixer diodes, etcetera.

Another object is to provide a novel planar process of the type described wherein conventional annealing steps used to remove ion implantation damage and to electrically activate ion implantated regions have no adverse effect on the passivation and current limiting characteristics of other non-implanted portions of the semiconductor structures thus formed.

Another object is to provide a planar fabrication process of the type described which permits excellent process control over the geometry, the impurity concentration and the impurity profile of the ion implanted regions of the device.

Another object is to provide an ion implantation planar process of the type described in which multiple ion implantation steps may be used in the fabrication of double drift as well as single drift IMPATT diodes.

Another object is to provide ion implanted and planar passivated high frequency semiconductor devices of the type described exhibiting both improved PN junction passivation characteristics and also improved control of parasitic characteristics for the equivalent circuit for these devices.

Another object is to provide a new semiconductor device of the type described which is planar passivated and does not require mesa-type etching steps to define the lateral extent (and capacitance) of its PN junction.

A further object is to provide a novel ion implantation planar process of the type described wherein conventional annealing steps may be utilized to control the lateral position of the device's PN junction without adversely affecting other portions of the structure.

A feature of the present invention is the provision of a novel semiconductor device structure wherein the doped active regions thereof are surrounded by an annulus of high resistivity semiconductive material, thereby limiting the current flow within the device substantially to these doped regions.

Another feature of the invention is the creation of a novel semiconductor device structure whose equivalent circuit includes, among other things, a high impedance path through the semiconductor crystal in parallel with the main low impedance current path of the device structure to thereby minimize microwave losses in the structure while substantially increasing the natural resonant frequency of the device structure.

Another feature is the provision of a device structure of the type described which is packaged in a small space and exhibits a high structural strength.

These and other objects and features of the invention will become more readily apparent in the following description of the accompanying drawings.

DRAWINGS

FIG. 1 illustrates, in schematic cross-section, one prior art device structure based on the Murphy and Henry Pat. Nos. 3,649,386 and 3,896,478 respectively over which the present invention is an improvement.

FIG. 1b is an equivalent circuit diagram for the device structure in FIG. 1a.

Figure 1A:
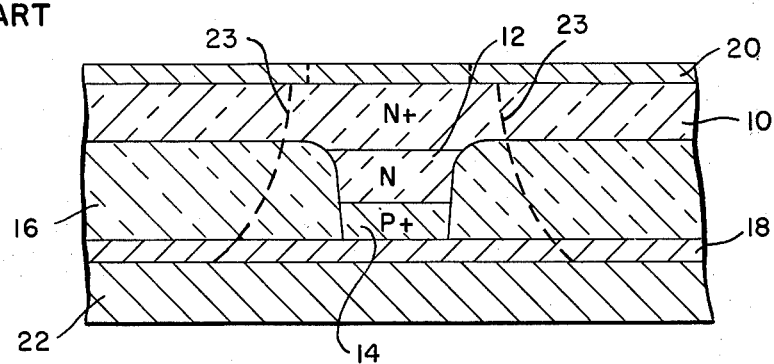

Referring now to FIG. 1a, there is shown one prior art semiconductor device structure based on the Murphy and Henry approach which is known to us as a planar - mesa structure and includes the N+, N and P+ semiconductive layers 10, 12 and 14 as shown. Typically, the N and P+ layers 12 and 14 will initially be formed as epitaxial layers or epitaxial and diffused layers which are coextensive with the substrate 10 in one dimension. Conventional masking and etching techniques well known in the art may be utilized to carve out the mesa geometry for the N and P+ regions 12 and 14. Thereafter, an insulating and passivating layer 16, such as silicon dioxide or silicon nitride or a combination of both, may be formed around the individual semiconductor mesas as shown, so that the exterior or lower surface of the dielectric oxide layer 16 is substantially coplanar with the exterior or lower surface of the P+ region 14. Thus, the dielectric layer 16 has been formed to "planarize" the semiconductor mesa structure and thereby make it possible to deposit a layer of contact metallization 18 on the structure in a planar fashion. Backside contact metallization 20 and suitable heat sink metallization 22 is also applied to the composite structure shown using conventional metal deposition techniques. For high-frequency microwave diode applications (i.e. IMPATT diodes) an additional mesa step is performed through the oxide as depicted by the dashed lines 23 in FIG. 1a and discussed generally above in the section entitled "Background and Relevant Prior Art".

Figure 1B:
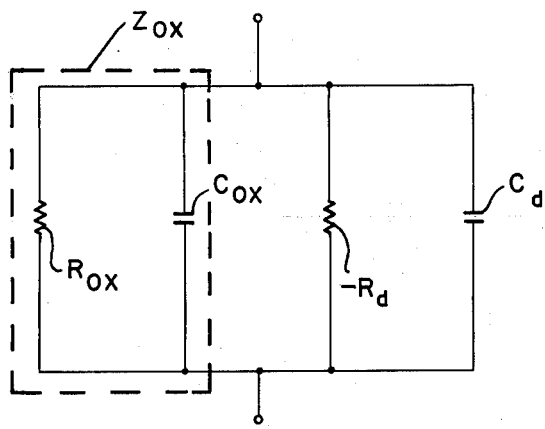

The equivalent circuit for the device of FIG. 1a is given in FIG. 1b and includes the negative resistance and the capacitance of the series path through the PN junction of the device, $-R_d$ and $C_d$ respectively, and also includes the resistance and capacitance, $R_{ox}$ and $C_{ox}$ respectively, of the oxide layer 16 surrounding the semiconductor mesa. It is these circuit parameters $R_{ox}$ and $C_{ox}$ enclosed by a dashed line $Z_{ox}$ in FIG. 1b that produce unacceptable microwave losses in the device structure in FIG. 1a when it is operated at frequencies in excess of about 100 GHz. Ideally, one prefers to have an infinite impedance in this oxide parallel path of the equivalent circuit, or an open circuit in place of $R_{ox}$ and $C_{ox}$ for optimum device performance and a minimum of microwave losses. The present invention teaches, among other things, how the equivalent circuit impedance in parallel with $-R_d$ and $C_d$ can be substantially increased relative to the combined impedance of $R_{ox}$ and $C_{ox}$ in the equivalent circuit of FIG. 1b.

Figure 2A:
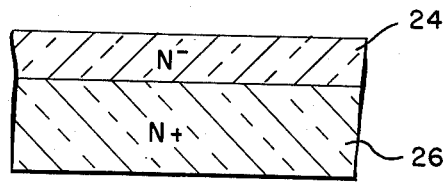
FIGS. 2a – 2b through FIG. 6 illustrate, respectively, a sequence of wafer processing steps which may be utilized in fabricating device structures according to the invention, and these figures include the impurity concentration profiles at various stages of the process.
Figure 2B:
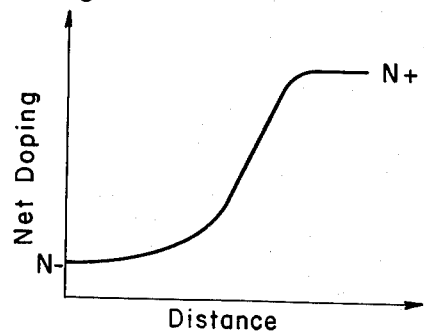
Figure 6:
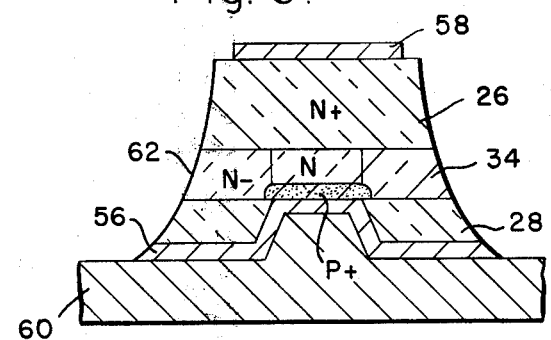

To accomplish such an increase in device impedance, reference should now be made respectively to FIGS. 2a – 2b through FIG. 6 wherein, initially, a relatively high resistivity N− epitaxial layer 24 is grown on a relatively low resistivity N+ substrate 26, as shown in FIG. 2a. The resistivity of the epitaxial layer 24 will typically be on the order of 1 ohm.cm or greater, whereas the resistivity of the substrate will typically be of the order of about 0.001 ohm.cm. Furthermore, the substrate thickness after thinning will typically be about 25 micrometers, whereas the epitaxial layer thickness will be determined from Eq. 1 and will be typically less than 1 micrometer for millimeter wavelength operation. During the epitaxial growth process, the impurity concentration of the grown epitaxial layer 24 is controlled only to the extent that a low doped profile is formed as shown in FIG. 2b, where distance, X, represents the distance into the semiconductor crystal proceeding from the upper surface of layer 24 thereof.

Figure 3A:
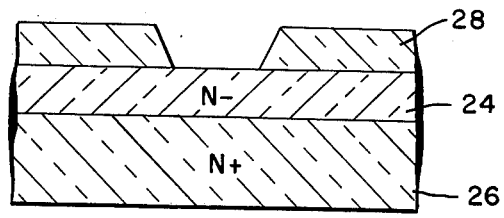
Figure 3B:
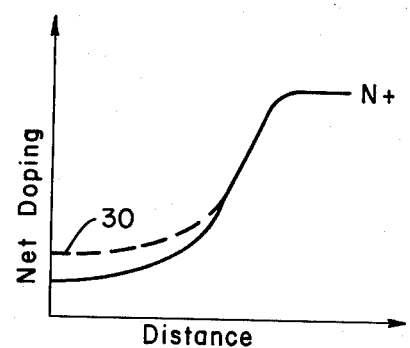

Next, a dielectric layer with a low loss tangent and passivating mask 28, is thermally grown or pyrolytically deposited or both and etched in the geometry shown in FIG. 3a. The area of the exposed hole is made equal to the desired area of the diode. The thickness of the insulating layer is adjusted to prevent ion penetration to the underlying high-resistivity semiconductor. For silicon diodes designed to operate above 30 GHz, a good choice for the insulator 28 is $SiO_2$ with a thickness of the order of several micrometers. This will insure that the ion species used to dope the crystal are masked out of the N− epitaxial layer 24 for their projected range, $R_p$, or a distance about equal to the thickness of the epitaxial layer 24. During the thermal oxide growth step or high temperature densification step used to form the $SiO_2$ mask 28, which typically requires temperatures of the order of about 1000° C or higher, a slight out-diffusion of dopant impurities from the N+ substrate 26 into the N− epitaxial layer 24 will produce the slight shift 30 in the doping profile of the structure, as indicated by the dashed line in FIG. 3b.

Referring now to FIGS. 4a through 4d, respectively, the masked semiconductor crystal is exposed initially to an N type ion implantation step wherein, for example, phosphorus ions are implanted into the central region of the semiconductor crystal with a combined projected range, $R_p$, approximately equal to the epitaxial layer thickness. For this implantation, a typical dosage would be about $4 \times 10^{12}$ ions/cm$^2$ and a typical accelerating voltage would be about 600 keV. However, these values will be varied with the multiple implantations shown in FIG. 4b. Thus, these N type ion implantation steps will produce the central N type region 32 which is now surrounded by the N− region 34, and the actual impurity concentrations of these separate portions of the epitaxial layer are given in the doping profile of FIG. 4C.

Figure 4A:
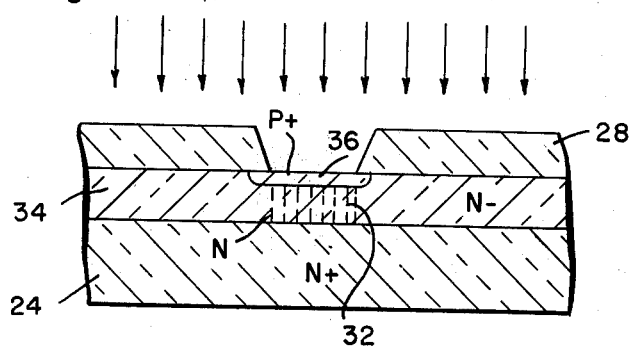
Figure 4B:
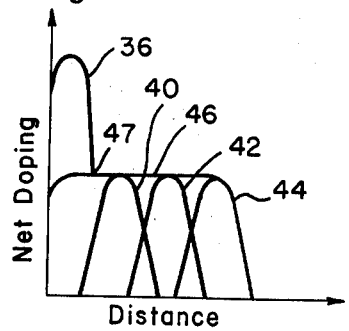
Figure 4D:
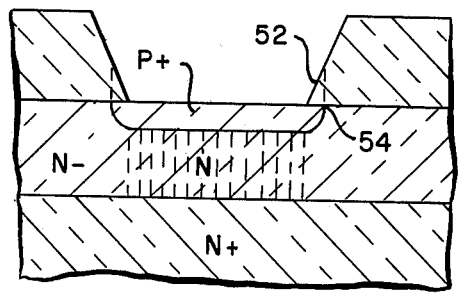
Figure 4C:
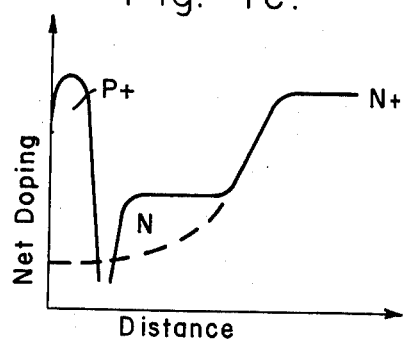

For a single-drift P+ - N - N+ IMPATT diode the multiple implantations 40, 42 and 44 in FIG. 4b each have a different projected range, $R_p$, in order to give a resultant or composite N type profile 46 having a relatively uniform N type impurity concentration over most of the epitaxial layer thickness, or from the N - N+ substrate interface of region 32 to the point 47 indicated. At point 47 the P+ impurity profile of much higher impurity concentration meets the N type portion 46 of the composite impurity to form a P+-N junction profile.

The shallow P+ region 36 of FIG. 4a may be formed either by ion implantation doping or by diffusion and advantageously boron ions may be implanted into the semiconductor crystal to a depth of about 0.2 micrometers to thereby form the P+-N junction 47 which terminates beneath the $SiO_2$ layer 28. A typical P+ dosage of boron ions for this step is $5 \times 10^{14}$ ions/cm$^2$ and a typical accelerating voltage for this step will be about 16 kev.

As a result of the particular slanted contour of the opening in the $SiO_2$ layer 28, which is produced by the normal chemical etching of the thermally grown or pyrolitically deposited/annealed oxide layer, the boron ions (P+ profile) are able to penetrate a peripheral region 52 of the inner annular edge of the $SiO_2$ layer 28 where it joins the epitaxial layer surface. This feature insures that the PN junction perimeter 54 is always located beneath the oxide layer 28 where it is permanently passivated. Dilute hydrofluoric acid (HF) used to etch the $SiO_2$ tends to etch isotropically and this results in the contoured opening, as is shown better in the enlarged view in FIG. 4d.

It will be appreciated by those skilled in the art that, contrary to prior art processes, both the N− passivating and current limiting region 34 of the epitaxial layer, and the passivating silicon dioxide layer 28 are formed prior to ion implantation doping. This establishes the current limiting and passivation characteristics of the ultimate device structure and these characteristics are not adversely affected by the subsequent annealing processes used to electrically activate the device and remove ion implantation damage therein. Additionally, this annealing process tends to slightly move the PN junction perimeter 54 toward the outer edges of the device structure and can be used to control the lateral movement of the PN junction 54 and insure complete junction passivation at the PN junction perimeter.

Figure 5:
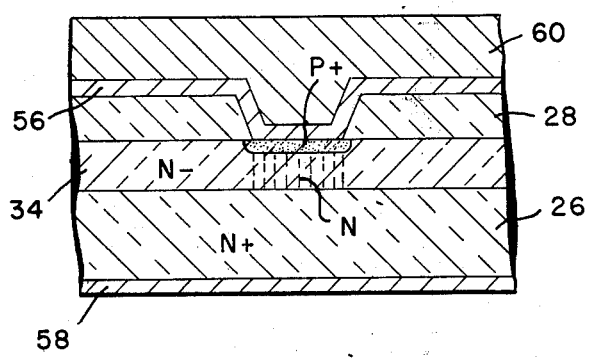

The ion implanted structure in FIG. 4a is transferred to an anneal furnace wherein, typically, it will be annealed at 900° C for approximately 30 minutes. After annealing, the implanted structure is removed from the anneal furnace (not shown) and transferred to a conventional metallization deposition station for the formation of electrical contacts and any necessary heat sinks, as shown in FIG. 5. Specifically, a thin layer 56 of surface contact metallization, such as a combination of chrome, platinum and gold, is initially deposited on to the surface composed of the $SiO_2$ and open holes to the implanted diodes, and thereafter a copper heat sink 60 is thermal-compression bonded or electroplated to the metal layer 56 to provide the necessary heat sinking for the implanted PN junction of the device. To reduce resistive contact losses at microwave frequencies in the N+ substrate 26, this region is thinned typically to 25 micrometers before thin metal contact layers 58 of chrome and gold are deposited.

Finally, in order to provide individual structures with the desired ultimate mesa geometry dictated by the particular power and frequency requirements of the device, a conventional etching step is applied which etches from the metallized N+ substrate side to remove portions of the semiconducting, insulating and metal layers of FIG. 5 to leave the resultant mesa geometry of FIG. 6, including the contoured edges 62 as indicated. This mesa etching step precisely controls the volume of the N− region 34 and oxide layer 28 to thereby reduce the reactances of these layers and their corresponding microwave losses.

Thus, it is readily apparent from FIG. 6 that a microwave PN junction diode has been formed which is fully passivated by a surrounding ring or annulus of $SiO_2$ 28 and high resistivity N− silicon 34. The parasitic inductance L of this new geometry is minimized because the top and bottom surfaces of the planar-mesa device are bonded directly to layers of contact, 58 and 56, and heat sink metallization 60. Such metallization would then complete the package of the diode, and the top and bottom metal surfaces of the structure shown in FIG. 6 could be contacted directly to a DC bias pin in a microwave cavity or the like.

Figure 7:
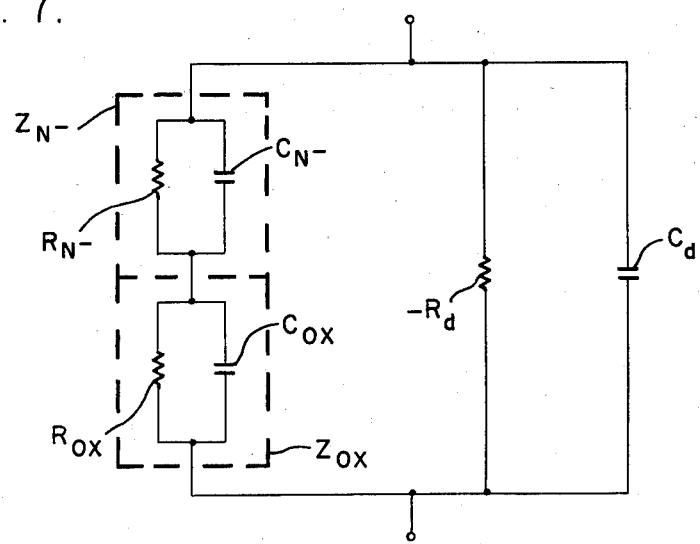
FIG. 7 is an equivalent circuit for the device structure shown in FIG. 6.

Referring now to FIG. 7, there is shown the equivalent electrical circuit for the novel semiconductor device in FIG. 6 and includes the negative resistance $-R_d$ and the associated capacitance $C_d$ of the PN junction of the device and of the main path therethrough. Additionally, the structure of FIG. 6 includes a parallel or auxiliary path connection having a resistance $R_{N-}$ and capacitance $C_{N-}$ associated with the N− annular ring 34. It is this additional impedance $Z_{N-}$ which distinguishes the equivalent circuit of FIG. 7 over the equivalent circuit of FIG. 1b.

Another distinguishing feature of the structure shown in FIGS. 6 and 7 is the thick insulating layer and high $Z_{ox}$ value compared to the prior art structure shown in FIGS. 1a and 1b which has an insulating layer of smaller thickness and therefore a lower $Z_{ox}$ value.

The equivalent circuit of FIG. 7 of course includes the resistance $R_{ox}$ and capacitance $C_{ox}$ associated with the thick oxide layer, and the combined high impedance $Z_{ox}$ is in series with the lower impedance $Z_{N-}$ of the N− annular ring 34. Thus, the provision of the high impedance $Z_{ox}$ in the equivalent circuit of FIG. 7 substantially raises the parallel path resistance shunting $-R_d$ and $C_d$, and thereby simultaneously raises the natural resonant frequency, $f_{pack}$, of the novel device of FIG. 6. This feature enables the device of FIG. 6 to operate in a resonant cavity at much higher frequencies than the prior art device in FIG. 1a and without interferring with the resonant frequency of operation of the cavity.

Figure 8A:
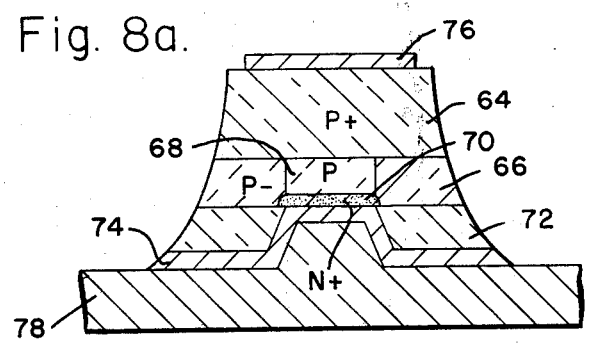
FIGS. 8 through 13 illustrate six other useful semiconductor device structures and their associated doping profiles which may be fabricated using the novel ion implantation planar process of the invention.
Figure 8B:
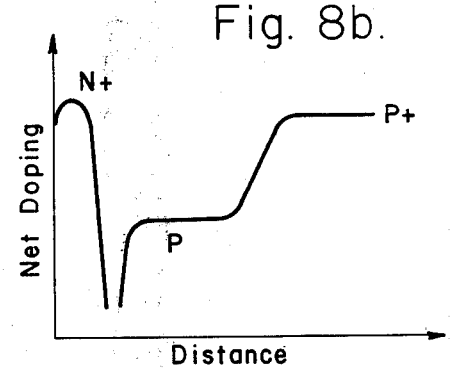

Referring now in succession to the novel device structures shown in FIG. 8 through 13, there is shown in FIG. 8a the P+ - P - N+ complement of the device structure of FIG. 6 and includes a P+ substrate 64, a P− epitaxial layer 66 joined thereto, and a P type ion implanted central region 68 formed in the center of the epitaxial layer 66. A shallow diffused or ion implanted region 70 of N+ impurity concentration is formed as shown at the surface of the epitaxial layer 66 and a passivating silicon dioxide layer 72 is formed on the surface of the epitaxial layer 66. The $SiO_2$ layer 72 passivates the PN junction which terminates at the surface of the epitaxial layer 66. Contact metallization 74 and 76 is formed in the geometry shown on opposing surfaces of the semiconductor structure, and a copper heat sink 78 is bonded to the contact metallization layer 74 in a manner identical to the metallization and bonding techniques used in fabricating the structure of FIG. 6. The impurity concentration profile in FIG. 8b is the exact shape of the impurity concentration profile of FIG. 4c, and it should be noted that the semiconductor device structures in both FIG. 6 and 8a can be used as TRAPATT as well as IMPATT diodes, as will be appreciated and understood by those skilled in the art.

Figure 9A:
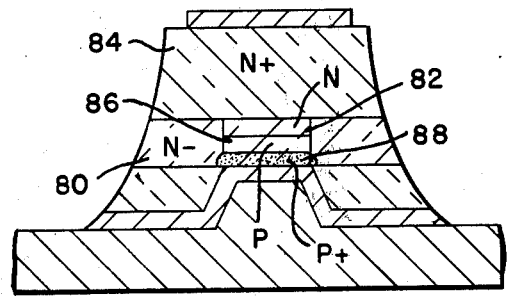
Figure 9B:
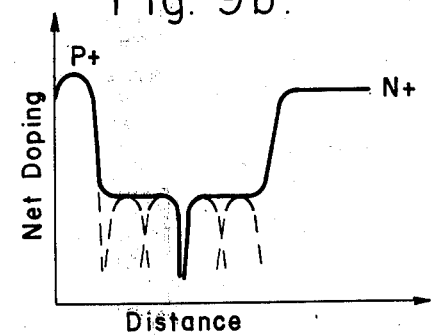

Referring now to FIG. 9a, there is shown a double drift P+ N+ IMPATT diode wherein multiple ion implantations as indicated in FIG. 9b have been performed in the N− epitaxial layer 80 of the structure. These multiple implantations provide, as indicated in FIG. 9b, an N type region 82 immediately adjacent the N+ substrate 84, and also a P type central region 86 which is interposed between the N type region 82 and the P+ shallow surface region 88. In all other respects, the double drift structure of FIG. 9a is identical to the single drift structures of FIG. 6 and 8a, and of course the N+ - N - P - P+ complement of the double drift structure of FIG. 9a can be fabricated in accordance with the teachings of the present invention.

Figure 10A:
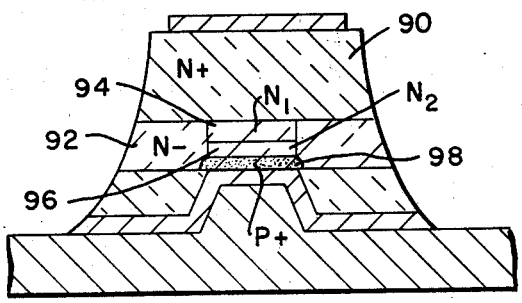
Figure 10B:
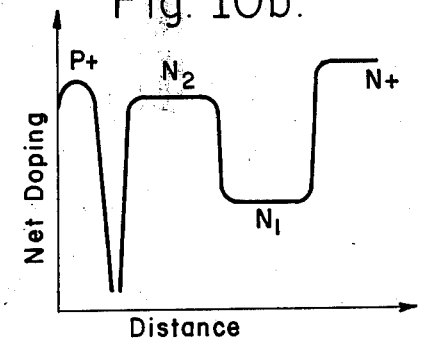

Referring now to FIG. 10a, there is shown a semiconductor device structure which may be operated as either a back-to-back IMPATT-TRAPATT diode or as a modified Read-type IMPATT diode. This device structure is the same as the device structure of FIG. 9a in that the substrate 90 has a heavily doped N+ impurity concentration and the central active region of the structure surrounded by the N− epitaxial annulus 92 includes an ion implanted $N_1$ type region 94, an ion implanted $N_2$ region 96, and an ion implanted P+ shallow surface region 98. The impurity concentration profile for this P+ - $N_2$ - $N_1$ - N+, where $N_2$ is greater than $N_1$, structure is shown in FIG. 10b, and finds useful applications in high power oscillators and amplifiers at frequencies in the range of 1 to 100 GHz.

Figure 11A:
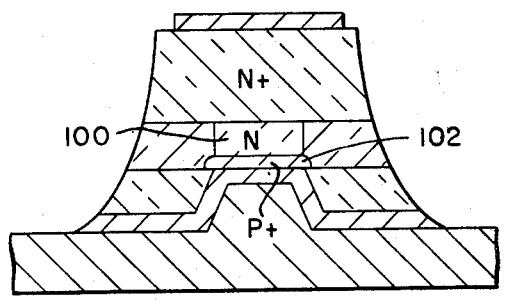
Figure 11B:
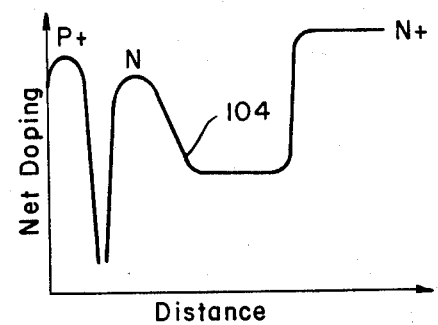

Referring now to the non-IMPATT and non-TRAPATT types of semiconductor devices in FIGS. 11 through 13, which may be fabricated in accordance with the present process, there is shown first in FIG. 11a an P+ - N - N+ varactor diode. The device geometry of FIG. 11a is identical in all respects to the device geometry of FIG. 6. But the doping of the N and P type regions 100 and 102 respectively of the structure are profiled by controlled multiple ion implantations to give these central active regions of the structure the impurity concentration profile as shown in FIG. 11b. This type of profile is preferred for varactor diode operation because of the particular capacitance-voltage characteristics frequently required of varactor diodes and the fact that such capacitance-voltage characteristics require the retrograded type of impurity concentration profile shown in 11b, including the linear slope 104 of the N type region 100 of the device structure.

Figure 12A:
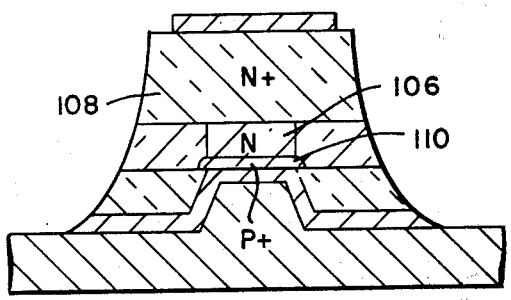
Figure 12B:
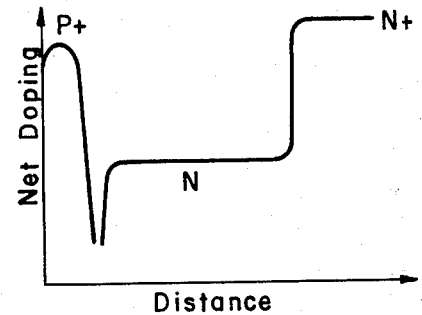

Referring now to the PIN type of diode shown in FIG. 12a, the central portion or "I" region of the diode is actually a relatively high resistivity N type region 106, whereas the "N" region of the PIN structure is the N+ substrate 108. The P region of the PIN structure is the shallow P+ region 110, and in all other respects the device geometry of FIG. 12a is identical to the device geometry of FIGS. 6, 8a and 11a. The impurity profile for the PIN type diode of FIG. 12a is shown in FIG. 12b, and this type of high power, high current switching diode is well known in the art and will therefore not be described in further detail herein.

Figure 13A:
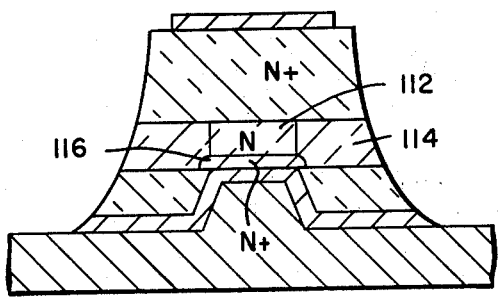
Figure 13B:
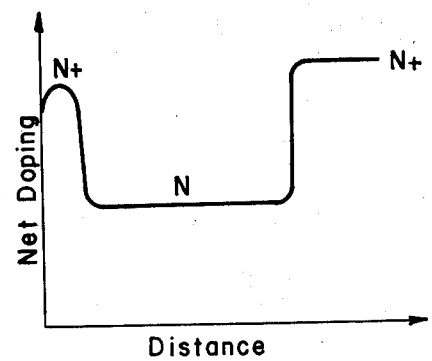

Referring now to the Gunn diode shown in FIG. 13a, this structure differs from previously described device structures with identical device geometries in that it is an N+ - N - N+ gallium arsenide structure, possessing the transferred electron negative resistance Gunn effect, and having the N type impurity concentration profile shown in FIG. 13b. The Gunn effect diode is a well known semiconductor device and requires the particular type of profile shown in FIG. 13b for its well known Gunn effect operation. The central ion implanted N type region 112 of the diode is surrounded by an N− epitaxial layer 114 as previously described above with reference to the other devices of the invention, and the shallow N+ surface region 116 may be formed either by ion implantation diffusion or alloying to achieve the profile shown in FIG. 13b. Gunn effect diodes are well known in the art for their relatively low noise operation and are also used generally for lower power applications than silicon IMPATT structures.

Thus, there have been described above only a few of the high frequency semiconductor diodes which may be fabricated in accordance with the teachings of the present invention. For example, other diodes, such as Schottky barrier diodes could be fabricated rather than PN junction devices in accordance with our claimed process and novel device structure.

What is claimed is:

1. A planar process for fabricating high frequency impact avalache transit time (IMPATT) devices having precisely controlled parasitic loss parameters and with structural characteristics which allow direct mounting into a microwave cavity, including the steps of:
   a. forming a relatively thick insulating mask on the surface of a semiconductor crystal composed of a substrate of one conductivity type and a layer of said one conductivity type disposed thereon and of higher resistivity than said substrate.
   b. implanting one or more ion species of said one conductivity type through an opening in said mask and into a central region of said crystal and thru said layer to thereby leave said central region of said crystal surrounded by a higher resistivity annular region
   c. implanting further ion species through said opening in said mask and into said central region of said crystal to thereby form a planar PN junction terminating beneath said mask at the surface of said crystal,
   d. annealing said semiconductor crystal to a predetermined elevated temperature sufficient to remove substantial amounts of ion implantation damage in said crystal and to electrically activate the ion implanted regions thereof,
   e. depositing a layer of contact metalization on said insulating mask and extending into an opening thereof and into electrical contact with said central region of said semiconductor crystal,
   f. bonding a heat sink to said contact metalization whereby said heat sink is in close proximity to said central region for providing a maximum of heat transfer therefrom, and portions of said contact metalization and heat sink remote from said central region are separated from said semiconductor crystal by the thickness of said relatively thick insulating mask which minimizes the capacitance and maximizes the resistance between said semiconductor crystal and said heat sink and thus minimizes microwave losses in said devices, and
   g. removing a predefined portion of a region of said semiconductor crystal surrounding said central region and also removing a predefined portion of a region of said insulating mask surrounding the contact metalization making electrical contact with said central region to further minimize microwave losses in said devices and improve the high frequency performance thereof.

2. A planar process for fabricating high frequency impact avalanche trasit time (IMPATT) devices in a semiconductor structure comprising the steps of:
   a. forming an epitaxial semiconductor layer on the surface of a semiconductor substrate and of higher resistivity than said substrate,
   b. forming a relatively thick insulating mask on the surface of said epitaxial layer,
   c. implanting ions of one conductivity type through an opening in said mask and into and thru a central region of said epitaxial layer, leaving the ion implanted central region surrounded by an annular region of said epitaxial layer of higher resisitivity than said central region,
   d. introducing opposite conductivity type impurities into said central region to thereby form a PN junction which terminates at the surface of said epitaxial layer and beneath said insulating mask,
   e. annealing the crystal structure of step (d) at a predetermined elevated temperature sufficient to remove substantial amounts of ion implantation damage in said semiconductor crystal structure and to electrically activate the ion implanted regions therein without adversely affecting the passivation and current limiting characteristics of either said insulating mask or said epitaxial layer,
   f. depositing a layer of contact metalization on said insulating mask and extending into an opening thereof and into electrical contact with said central region of said semiconductor crystal,
   g. bonding a heat sink to said contact metalization whereby said heat sink is in close proximity to said central region for providing a maximum of heat transfer therefrom, and portions of said contact metalization and heat sink remote from said central region are separated from said semiconductor crystal by the thickness of said insulating mask which maximizes the resistance and minimizes the capacitance between said semiconductor crystal and said heat sink and thus minimizes microwave losses in said devices, and
   h. removing a predefined portion of a region of said semiconductor crystal surrounding said central region and also removing a predefined portion of a region of said insulating mask surrounding the contact metalization making electrical contact with said central region to further minimize microwave losses in said devices and improve the high frequency performance thereof.

3. The process defined in claim 2 wherein
   a. said one conductivity type impurities are N type impurities and
   b. said opposite conductivity type impurities are P type impurities which form said PN junction and thereby define the geometry of a single drift IMPATT diode.

4. The process defined in claim 2 which includes:
   a. implanting opposite conductivity type impurities to a predetermined depth and impurity concentration to thereby form a P type region in said central region of said epitaxial layer, and thereafter
   b. implanting a higher concentration of said P type impurities into said central region and to a shallow depth near the surface of said epitaxial layer to thereby form a P+-P-N-N+ double drift IMPATT diode.

5. A planar process for fabricating high frequency ion implanted microwave devices in a semiconductor crystal including the steps of:
   a. forming an epitaxial layer of N− semiconductive material on an N+ semiconductor substrate to thereby form an N+-N− interface in a monocrystalline semiconductor body,
   b. forming a relatively thick insulating mask on the surface of said N− epitaxial layer,
   c. implanting N type ions through an opening in said mask and into said epitaxial layer with a projected range, $R_p$, located approximately at said N+-N− interface and defining a central ion implanted region of said epitaxial layer,
   d. introducing P type impurities into said central region to thereby form a PN junction therein terminating beneath said insulating mask,
   e. annealing the ion implanted crystal in step (d) above to a predetermined elevated temperature sufficient to remove a substantial amount of ion implantation damage within said semiconductor crystal and to electrically activate said ion implanted regions therein,
   f. depositing a layer of contact metalization on said insulating mask and extending into an opening thereof and into electrical contact with said central region of said semiconductor crystal,
   g. bonding a heat sink to said contact metalization whereby said heat sink is in close proximity to said central region for providing a maximum of heat transfer therefrom, and portions of said contact metalization and heat sink remote from said central region are separated from said semiconductor crystal by the thickness of said insulation mask which maximizes the resistance and minimizes the capacitance between said semiconductor crystal and said heat sink and thus minimizes microwave losses in said devices, and
   h. removing a predefined portion of a region of said semiconductor crystal surrounding said central region and also removing a predefined portaon of a region of said insulating mask surrounding the metalization making electrical contact with said central region to further minimize microwave losses in said devices and improve the high frequency performance thereof.

6. The process defined in claim 5 wherein the introduction of P type impurities includes introducing P+ ions into said central region of said semiconductor crystal to form a PN junction single drift IMPATT diode.

7. The process defined in claim 5 wherein the introduction of P type impurities into said central region includes implanting P type ions to a first depth and dosage within said crystal to establish a P type region within said central region and thereafter implanting P+ ions to a different, shallow depth and dosage into said central region to thereby form a P+ - P - N - N+ double drift IMPATT diode.

* * * * *